United States Patent
Yao et al.

(10) Patent No.: US 8,221,667 B2
(45) Date of Patent: Jul. 17, 2012

(54) METHOD FOR MAKING THERMAL INTERFACE MATERIAL

(75) Inventors: Yuan Yao, Beijing (CN); Feng-Wei Dai, Beijing (CN); Ji-Cun Wang, Beijing (CN); Hui-Ling Zhang, Beijing (CN); You-Sen Wang, Beijing (CN); Chang-Hong Liu, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 268 days.

(21) Appl. No.: 12/577,898

(22) Filed: Oct. 13, 2009

(65) Prior Publication Data

US 2010/0219550 A1 Sep. 2, 2010

(30) Foreign Application Priority Data

Mar. 2, 2009 (CN) .......................... 2009 1 0105874

(51) Int. Cl.
*B29C 39/10* (2006.01)
*B29C 45/14* (2006.01)
(52) U.S. Cl. ......... 264/261; 264/263; 264/294; 264/295
(58) Field of Classification Search .................. None
See application file for complete search history.

(56) References Cited

U.S. PATENT DOCUMENTS

| | | | | |
|---|---|---|---|---|
| 3,795,037 A * | 3/1974 | Luttmer | ........................ | 29/883 |
| 4,520,562 A * | 6/1985 | Sado et al. | ........................ | 29/878 |
| 5,316,080 A * | 5/1994 | Banks et al. | ................... | 165/185 |
| 5,818,700 A * | 10/1998 | Purinton | ........................ | 361/760 |
| 6,014,999 A * | 1/2000 | Browne | ........................ | 156/512 |
| 6,232,706 B1 * | 5/2001 | Dai et al. | ........................ | 313/309 |
| 6,283,812 B1 * | 9/2001 | Jin et al. | ........................ | 445/24 |
| 6,311,769 B1 * | 11/2001 | Bonneville et al. | ........... | 165/185 |
| 6,383,923 B1 * | 5/2002 | Brown et al. | ................. | 438/666 |
| 6,407,922 B1 | 6/2002 | Eckblad et al. | | |
| 6,504,292 B1 * | 1/2003 | Choi et al. | ..................... | 313/310 |
| 6,591,897 B1 * | 7/2003 | Bhatti et al. | ................. | 165/80.3 |
| 6,924,335 B2 * | 8/2005 | Fan et al. | ...................... | 524/495 |
| 6,965,513 B2 * | 11/2005 | Montgomery et al. | .. | 361/679.46 |
| 7,273,095 B2 * | 9/2007 | Li et al. | ......................... | 165/185 |
| 7,291,396 B2 * | 11/2007 | Huang et al. | .................. | 428/408 |
| 7,662,467 B2 * | 2/2010 | Li et al. | ..................... | 428/298.4 |
| 7,743,763 B2 * | 6/2010 | Grip et al. | ..................... | 126/569 |
| 7,784,531 B1 * | 8/2010 | Li et al. | ......................... | 165/185 |
| 2005/0167647 A1 * | 8/2005 | Huang et al. | ..................... | 257/14 |
| 2005/0224220 A1 * | 10/2005 | Li et al. | ......................... | 165/185 |
| 2005/0255304 A1 * | 11/2005 | Brink | ............................ | 428/209 |
| 2006/0071334 A1 * | 4/2006 | Kawabata et al. | ............ | 257/741 |
| 2006/0219689 A1 | 10/2006 | Huang et al. | | |
| 2007/0244245 A1 | 10/2007 | Liu et al. | | |
| 2009/0016951 A1 | 1/2009 | Kawabata et al. | | |

FOREIGN PATENT DOCUMENTS

| | | |
|---|---|---|
| JP | 2006-287179 | 10/2006 |
| JP | 2007-284679 | 11/2007 |
| WO | WO2007111107 | 10/2007 |

\* cited by examiner

*Primary Examiner* — Edmund H. Lee
(74) *Attorney, Agent, or Firm* — Altis Law Group, Inc.

(57) ABSTRACT

The present disclosure relates to a method for making a thermal interface material. A carbon nanotube array on a substrate is provided. The carbon nanotube array includes a plurality of carbon nanotubes substantially parallel to each other and substantially perpendicular to the substrate. The carbon nanotubes of the carbon nanotube array are slanted toward a central axis of the carbon nanotube array. A liquid matrix material is compounded with the carbon nanotube array. Additionally, the liquid matrix material is solidified.

20 Claims, 10 Drawing Sheets

METHOD FOR MAKING THERMAL INTERFACE MATERIAL

CROSS-REFERENCE TO RELATED APPLICATIONS

This application claims all benefits accruing under 35 U.S.C. §119 from China Patent Application No. 200910105874.2, filed on Mar. 2, 2009 in the China Intellectual Property Office, the disclosure of which is incorporated herein by reference.

BACKGROUND

1. Technical Field

The present disclosure relates to a method for making a thermal interface material.

2. Description of Related Art

Electronic components such as semiconductor chips are becoming progressively smaller, while at the same time heat dissipation requirements thereof are increasing. Commonly, a thermal interface material is utilized between the electronic component and an integrated heat spreader to dissipate heat generated by the electronic component. However, the performance of the thermal interface material is restricted by a heat conduction coefficient thereof. Heat conduction coefficients of thermal interface materials are now considered to be too low for many contemporary applications.

Conventional thermal interface materials are metallic. However, the metallic materials tend to have a much higher coefficient of thermal expansion than semiconductor devices. Mechanical stresses are induced during temperature cycling and tend to overstress the electronic component, which can potentially leads to failures.

Referring to FIG. 4, a typical thermal interface material 60 is a composite material obtained by diffusing a plurality of carbon nanotubes 64a in a polymer 62. The plurality of carbon nanotubes 64a forms a carbon nanotube array 64. The carbon nanotubes 64a in the carbon nanotube array 64 are parallel to each other and provide a heat conduction path in the polymer 62. Opposite ends of the carbon nanotubes 64a are exposed from the polymer 62. Usually, the thermal interface material 60 is made by a method of injection molding. In use, the thermal interface material 60 is located between an electronic component 66 and a cooling device 68. However, a dissipation surface 662 of the electronic component 66 is smaller than a dissipation surface 682 of the cooling device 68. Therefore, some of the carbon nanotubes 64a cannot establish a heat conduction path between the electronic component 66 and the cooling device 68, thus the heat conduction coefficient of the thermal interface material 60 is relatively low.

What is needed, therefore, is to provide a method for making a thermal interface material with a high heat conduction coefficient.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1A:
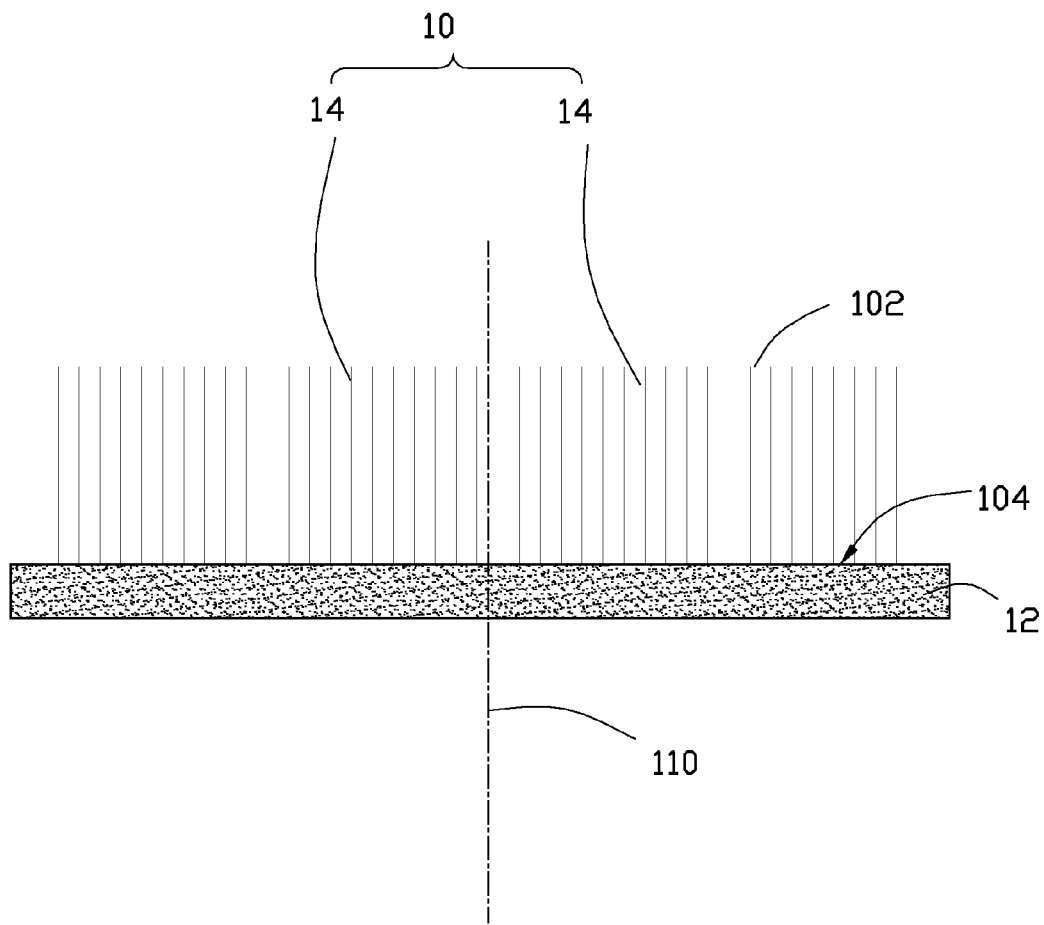
FIGS. 1(a) to 1(e) show schematic views of one embodiment of a method for making a thermal interface material.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIGS. 1(a) to 1(e), a method for making a thermal interface material 30 according to one embodiment includes:

(a) providing a carbon nanotube array 10 on a substrate 12, the carbon nanotube array 10 including a plurality of carbon nanotubes 14 substantially parallel to each other and substantially perpendicular to the substrate 12;

(b) slanting the carbon nanotubes 14 of the carbon nanotube array 10 toward a central axis 110 of the carbon nanotube array 10;

(c) providing a liquid matrix material 16 and compounding the liquid matrix material 16 with the carbon nanotube array 10; and (d) solidifying the liquid matrix material 16 to obtain the thermal interface material 30.

In step (a), interspaces are defined between the carbon nanotubes 14. The carbon nanotube array 10 can be directly formed on the substrate 12. The carbon nanotubes 14 have a bottom end adjacent to the substrate 12 and a top end farther away from the substrate 12. The carbon nanotubes 14 of the carbon nanotube array 10 can be single-walled carbon nanotubes, double-walled carbon nanotubes, multi-walled carbon nanotubes or combinations thereof. The substrate 12 can be a wafer or a cooling device. The carbon nanotube array 10 can be grown by conventional methods, such as chemical vapor deposition (CVD), arc discharging, or laser ablation. In one embodiment, the carbon nanotube array 10 is grown on a wafer by CVD.

Referring to FIG. 1(a), the carbon nanotube array 10 has a first surface 102 and a second surface 104 opposite to the first surface 102. The second surface 104 contacts with a surface of the substrate 12. The shape and the area of the first surface 102 and the second surface 104 are the same. Each of the carbon nanotubes 14 is substantially perpendicular to the substrate 12.

Figure 1B:
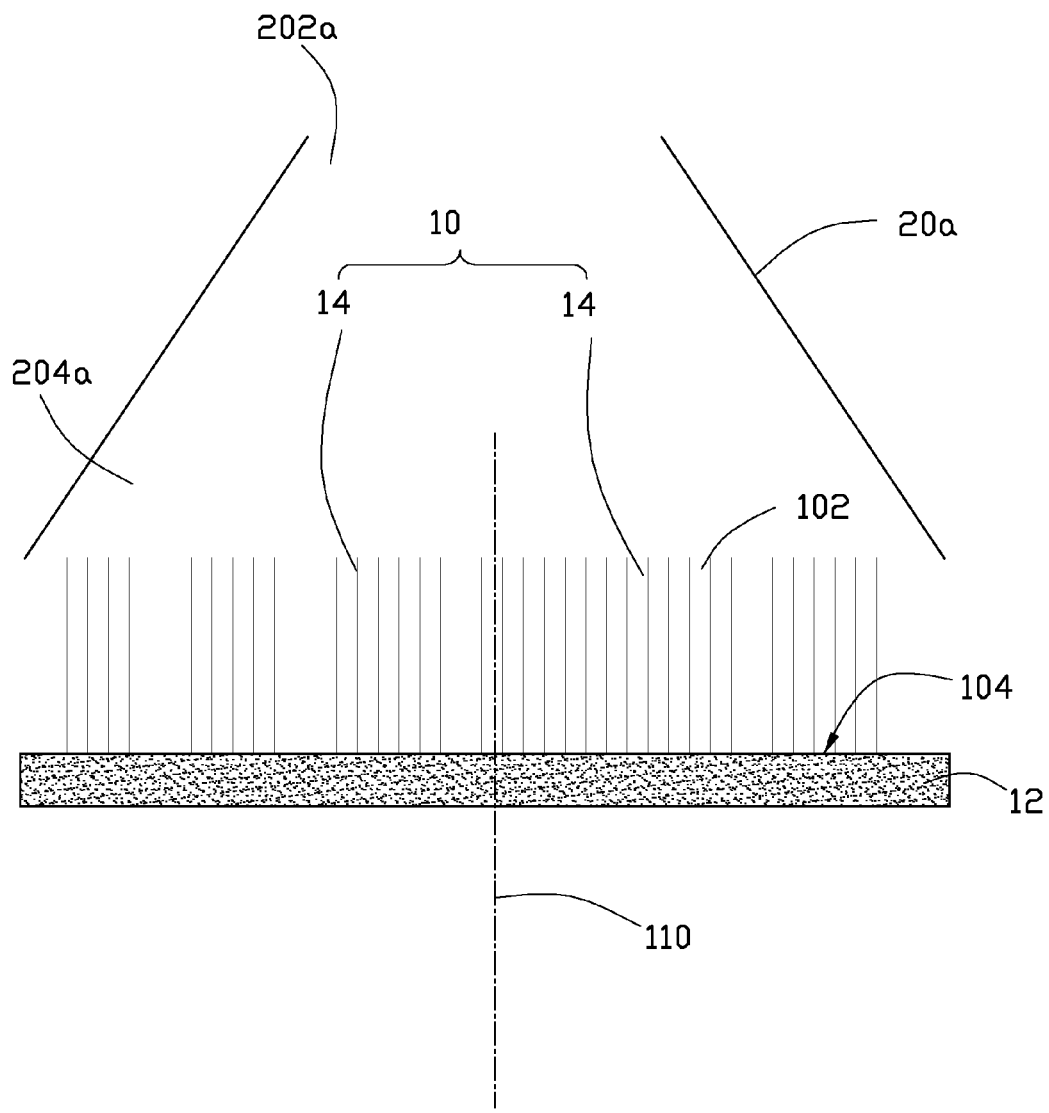
Figure 1C:
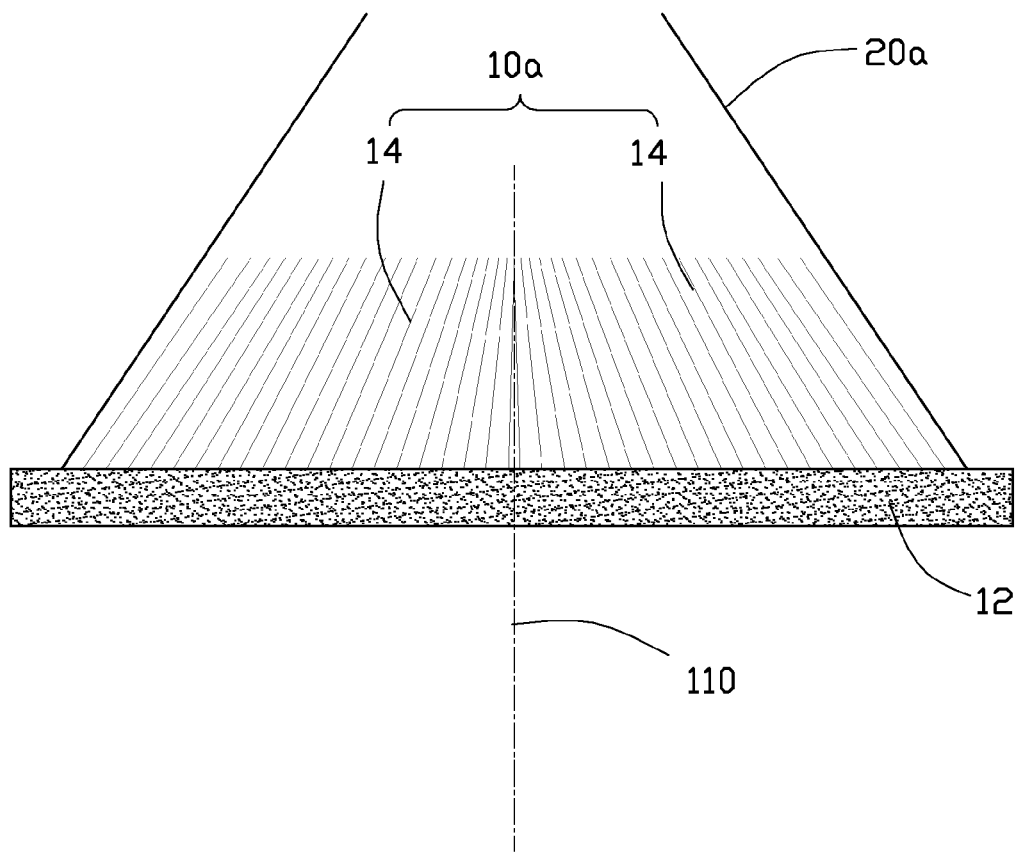
Figure 1D:
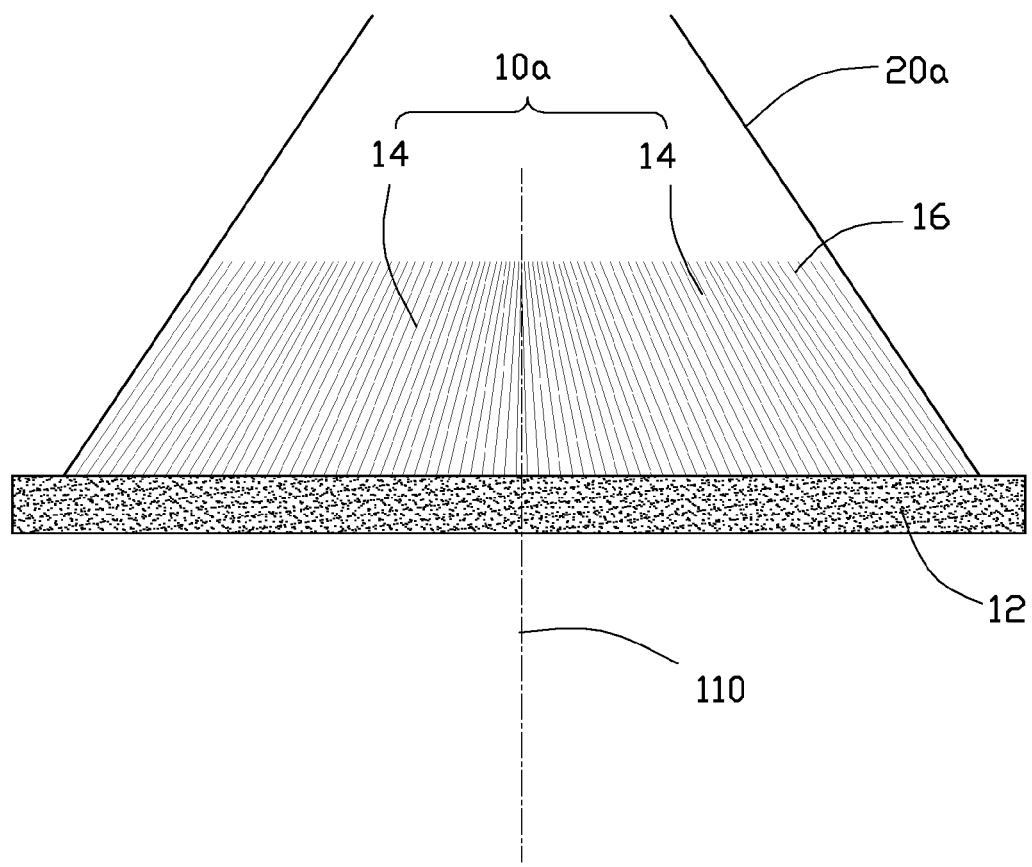
Figure 1E:
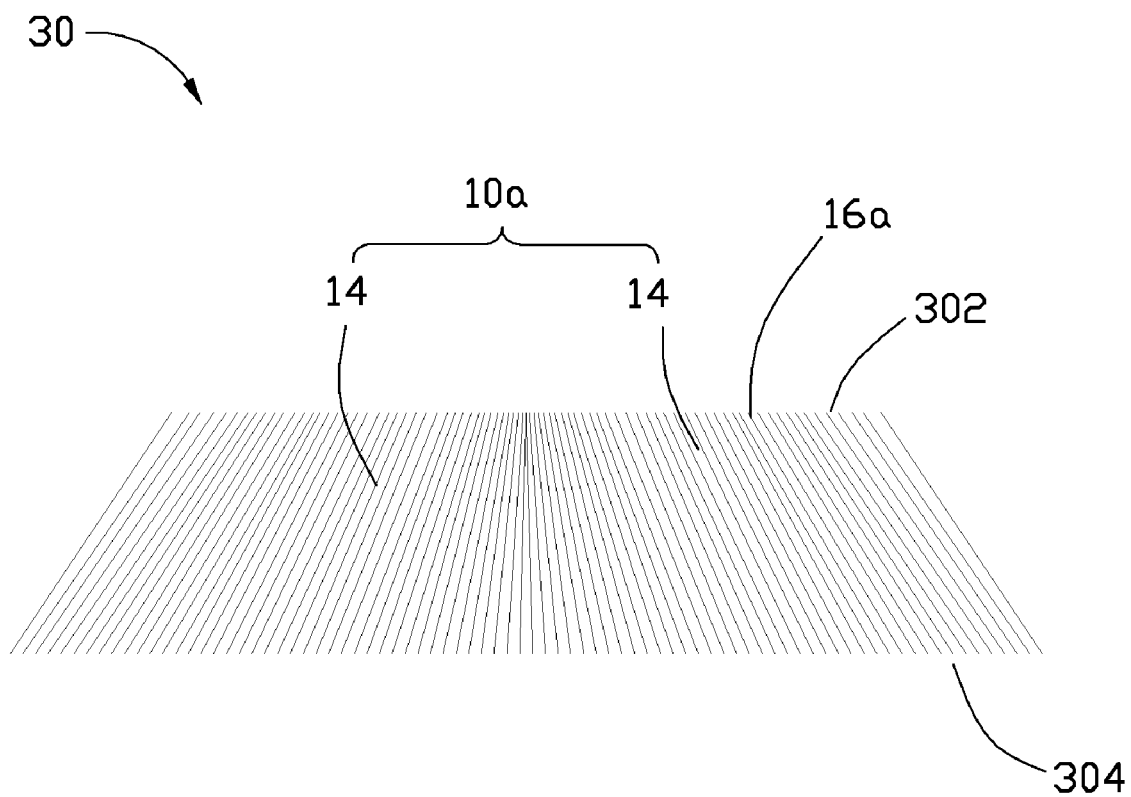
Figure 2A:
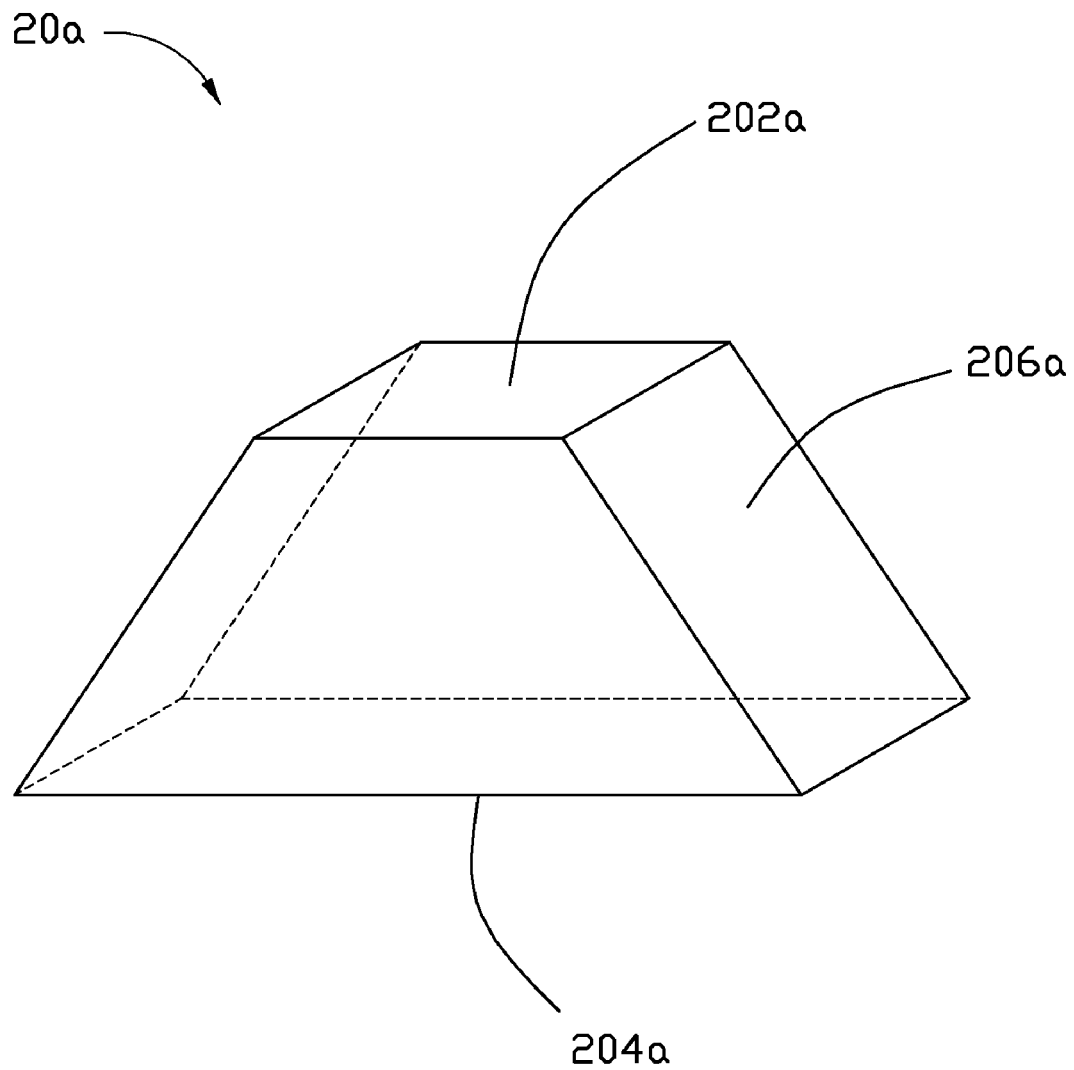
FIGS. 2(a) to 2(c) show different examples of a mold for making thermal interface material in FIG. 1(b).
Figure 2B:
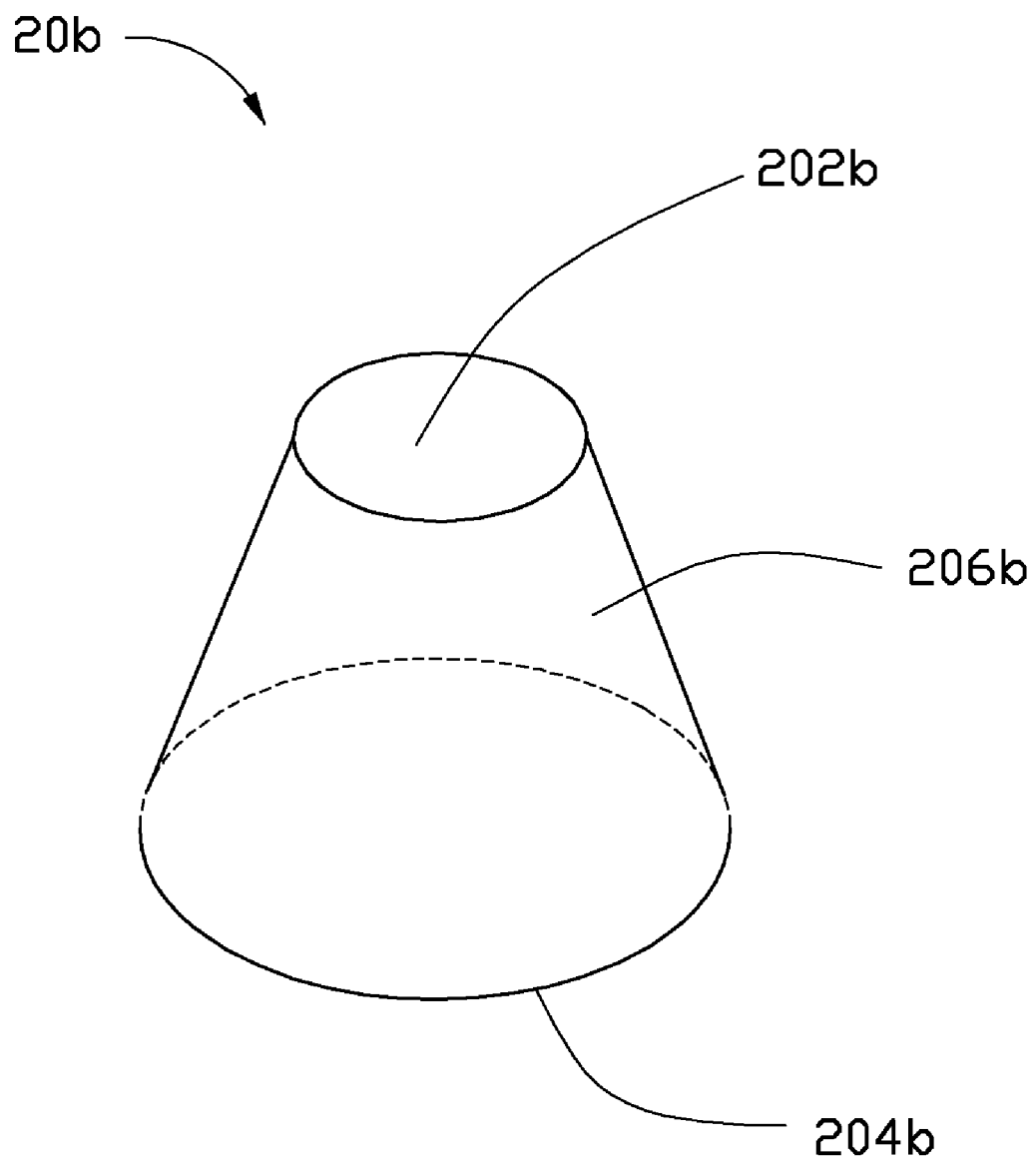
Figure 2C:
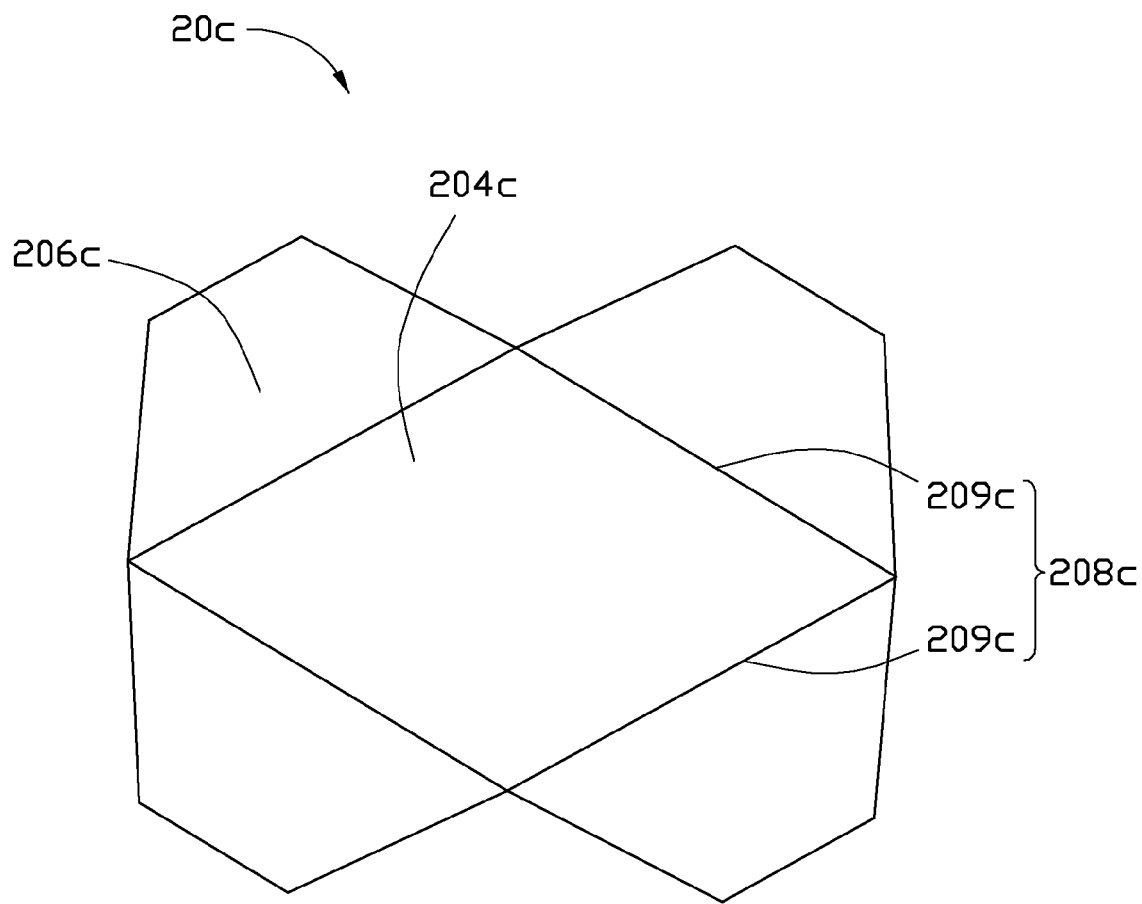

In step (b), a mold can be provided to press the carbon nanotube array 10 to form a frustoconical shaped carbon nanotube array 10a as shown in FIG. 1(c). The central axis 110 extends through the center of the first surface 102 and the center of the second surface 104 and is substantially perpendicular to the substrate 12. The mold can have many different configurations. FIGS. 2(a) to 2(c) show three examples of the mold, such as mold 20a, mold 20b, and mold 20c.

Referring to FIG. 2(a), the mold 20a can have a hollow structure defined by sidewalls 206a. A first opening 202a and a second opening 204a opposite to the first opening 202a are defined in the mold 20a. The size of the mold 20a decreases along a direction from the second opening 204a to the first opening 202a. The shape of the second opening 204a of the mold 20a corresponds to the shape of the second surface 104 of the carbon nanotube array 10. The area of the second opening 204a is equal to or greater than the area of the second surface 104 and the area of the first opening 202a is less than the area of the first surface 102. A layer of mold releasing agent (not shown), such as silicone oil, can be coated on the inner surface of the mold 20a. In one embodiment, the mold 20a is a hollow frustum of a pyramid shape with a layer of silicone oil coated on the inner surface thereof. Referring to FIG. 2(b), the mold 20b is frustoconical shaped. The mold 20b can have a hollow structure defined by a sidewall 206b. A first opening 202b and a second opening 204b opposite to the first opening 202b are defined in the mold 20b.

Referring to FIGS. 1(b) to 1(c), the mold 20a with the second opening 204a opposite to the carbon nanotube array 10 covers the carbon nanotube array 10 from the first surface 102 to the second surface 104 of the carbon nanotube array 10. The carbon nanotubes 14 lean toward the central axis 110 of the carbon nanotube array 10 under pressure from the sidewalls 206a. After being pressed by the sidewalls 206a of the mold 20a, the carbon nanotubes 14 extend from the second opening 204a to the first opening 202a as shown in FIG. 1(c). The density of the carbon nanotube array 10 increases along a direction from the second opening 204a to the first opening 202a. An alignment of the carbon nanotubes 14 of the carbon nanotube array 10a can meet the thermal conduction direction from the smaller dissipation surface of the electronic component to a larger dissipation surface of the cooling device in practical use, thus, the heat conduction coefficient of the thermal interface material 30 can be improved.

In another embodiment, the mold 20c as show in FIG. 2(c) is applied. The mold 20c includes a frame 208c and a plurality of plates 206c. The frame 208c defines an opening 204c. In one embodiment, the mold 20c includes a square frame 208c with four sides 209c joined end to end, and four isosceles trapezoid plates 206c. The longer side of each isosceles trapezoid plate 206c is fixed on the corresponding side 209c of the square frame 208c and the isosceles trapezoid plate 206c is rotatable around the side 209c. The mold 20c can be folded to form a hollow frustum of a pyramid shape, like the mold 20a. In another embodiment, the mold 20c is located around a square carbon nanotube array 10 to press the carbon nanotube array 10 by folding the four plates 206c.

In step (c), the liquid matrix material 16 can be a liquid thermo-plastic phase change polymer, a thermo-setting phase change polymer, or a low melting point metallic material. If the matrix material 16 is solid at room temperature, the matrix material 16 can be heated to liquid state.

The phase change polymer can be a polymer such as paraffin or ethoxyline resin, which can change from a solid phase to a fluid phase within a certain temperature range. Furthermore, at least one additive can be added into the phase change polymer. The additive is incorporated in the phase change polymer to improve the flexibility and stability of the phase change polymer and can also adjust the phase-change temperature of the phase change polymer to suit different requirements. In one embodiment, the phase change polymer is paraffin with a phase-change temperature in the range from about 50° C. to about 60° C. The additive is dimethyl sulfoxide.

Furthermore, a number of heat conducting particles can be dispersed in the phase change polymer to improve the heat conduction coefficient of the thermal interface material 30. The heat conducting particles can be metallic particles, ceramic particles or admixture thereof. The metallic particles can be aluminum (Al) particles, silver (Ag) particles, copper (Cu) particles or combinations thereof. The ceramic particles can be alumina particles, aluminum nitride particles, boron nitride particles or combinations thereof. The mass ratio of the heat conducting particles in the phase change polymer can be in a range of about 0.1% to about 5%.

The low melting point metallic material can be tin (Sn), copper (Cu), indium (In), plumbum (Pb), stibium (Sb), gallium (Ga), aurum (Au), silver (Ag), bismuth (Bi), aluminum (Al), alloy thereof or mixture thereof. The alloy can be an alloy of tin and plumbum, an alloy of indium and tin, an alloy of tin and silver, an alloy of aurum and gallium or an alloy of stibium and bismuth. In one embodiment, the low melting point metallic material is an alloy of stibium and bismuth with melting point below 200° C.

When the liquid matrix material 16 is a liquid phase change polymer, the combination of the carbon nanotube array 10 and the liquid matrix material 16 can be executed by immersing the carbon nanotube array 10 in the liquid phase change polymer or applying the liquid phase change polymer into the carbon nanotube array 10. In one embodiment, the liquid phase change polymer is injected into the carbon nanotube array 10. When the liquid matrix material 16 is a low melting point metallic material, the low melting point metallic material can be plated or injected into the carbon nanotube array 10. The low melting point metallic material is used as an anode, the carbon nanotube array 10 is used as a cathode, and the mold 20a can be made of insulative material such as ceramic or resin in the method of plating. The liquid matrix material 16 should be slowly introduced in the carbon nanotube array 10 so that the alignment of the carbon nanotubes 14 of the carbon nanotube array 10 is not changed.

In step (d), the liquid matrix material 16 can be solidified to form a matrix 16a by cooling, heating, or adding an initiator.

When the liquid matrix material 16 is a liquid thermoplastic phase change polymer, or a low melting point metallic material, the liquid matrix material 16 can be solidified by cooling. When the liquid matrix material 16 is a thermosetting phase change polymer, the liquid matrix material 16 can be solidified by heating. When the liquid matrix material 16 is a liquid prepolymer or a liquid monomer, the liquid matrix material 16 can be solidified by adding an initiator. In one embodiment, the liquid matrix material 16 is paraffin and solidified by cooling to form a matrix 16a.

After step (d), an optional step (e) of removing the mold 20a and the substrate 12 can be carried out. In step (e), the mold 20a can be removed directly because a layer of silicone oil is coated on the inner surface of the mold 20a as a mold releasing agent. The substrate 12 can be removed by mechanical polishing, chemical etching or tearing directly. In one embodiment, the process of removing the substrate 12 can include the substeps of: (e1) fixing the substrate 12; and (e2) removing the thermal interface material 30 from the substrate 12.

In step (e1), the substrate 12 can be fixed by an adhesive tape, adhesive or clamp. In step (e2), the thermal interface material 30 can be pried off from the substrate 12 by inserting a metal sheet between the thermal interface material 30 and the substrate 12. The metal sheet can be made of copper, iron or aluminum. A thickness of the metal sheet can range from about 5 micrometers to about 15 micrometers.

After step (e), a step (f) of slicing the thermal interface material 30 into a plurality of thermal interface pieces by a slicer may be carried out. Each of the thermal interface pieces has a thickness in the range of about 1 micrometer to about 30 micrometers. The step of slicing exposes at least some ends of the nanotubes 14 from surfaces of the matrix material 16. When the thickness of the pieces is small, some of the carbon nanotubes 14 have two ends exposed from the matrix material 16, thus the thermal interface material 30 has a greater heat conduction coefficient. In one embodiment, the matrix material 16 is paraffin and the thickness of the pieces is about 10 micrometers.

Furthermore, the matrix material 16 of the thermal interface material 30 can be etched to allow more ends of the carbon nanotubes 14 to be exposed from surfaces of the pieces. In one embodiment, the matrix material 16 is paraffin and the matrix material 16 is etched by oxygen plasma. In another embodiment, the matrix material 16 is a low melting point metal and is etched using acid.

Figure 3:
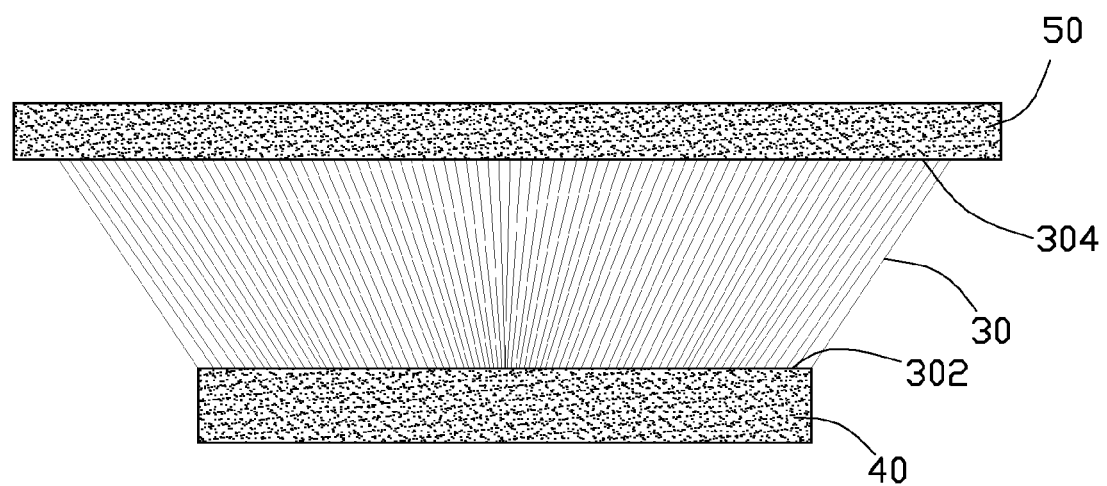
FIG. 3 is a schematic view of using the thermal interface material in FIG. 1(e).
Figure 4:
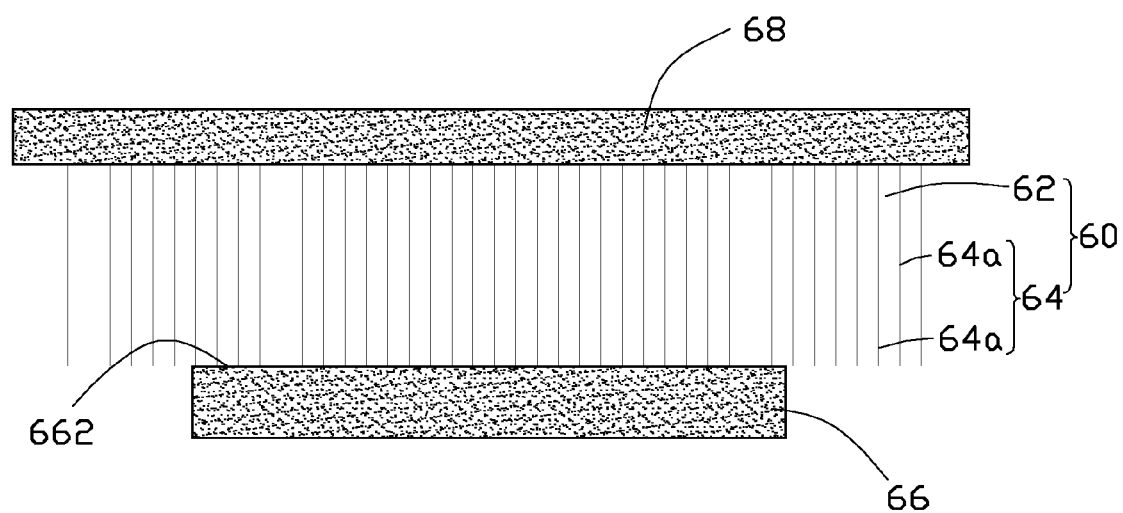
FIG. 4 is a schematic view of a related thermal interface material.

Referring to FIG. 3, in use, the thermal interface material 30 is sandwiched between an electronic component 40 and a cooling device 50. A smaller surface 302 of the thermal interface material 30 touches a top dissipation surface of the electronic component 40 and a larger surface 304 touches a bottom dissipation surface of the cooling device 50. Heat generated by the electronic component 40 is transmitted to the cooling device 50 via the thermal interface material 30. The heat conduction coefficient of the thermal interface material 30 is relatively high because each of the carbon nanotubes 14a of the thermal interface material 30 can establish a heat conduction path between the electronic component 40 and the cooling device 50.

When the temperature is in the range of about 50° C. to about 60° C., the thermal interface material 30 changes from a solid phase to a fluid phase. Thus, the thermal interface material 30 fills in the spaces between the dissipation surfaces, and ends of the carbon nanotubes 14 touch the dissipation surfaces to provide heat conduction paths. Therefore, a high heat conduction coefficient of the thermal interface material 30 is obtained. When the electronic component 40 does not generate heat, the thermal interface material 30 changes from a fluid phase to a solid phase.

Depending on the embodiment, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for making a thermal interface material, the method comprising:
   (a) providing a carbon nanotube array on a substrate, the carbon nanotube array comprising a plurality of carbon nanotubes substantially parallel to each other and substantially perpendicular to the substrate;
   (b) slanting the carbon nanotubes of the carbon nanotube array toward a central axis of the carbon nanotube array to obtain slanted carbon nanotubes;
   (c) providing a liquid matrix material and compounding the liquid matrix material with the slanted carbon nanotubes of the carbon nanotube array; and
   (d) solidifying the liquid matrix material with the slanted carbon nanotubes to form a matrix.

2. The method of claim 1, wherein the carbon nanotube array has a first surface contacting with the substrate and a second surface opposite to the first surface.

3. The method of claim 2, wherein the carbon nanotube array is pressed by a mold to slant the carbon nanotubes toward the central axis of the carbon nanotube array.

4. The method of claim 3, wherein the mold is a hollow structure defined by sidewalls and has a first opening and a second opening opposite to the first opening, a size of the mold decreases along a direction from the second opening to the first opening.

5. The method of claim 4, wherein a shape of the second opening of the mold corresponds to a shape of the second surface of the carbon nanotube array; an area of the second opening is equal to or larger than an area of the second surface of the carbon nanotube array; and an area of the first opening is less than the area of the first surface of the carbon nanotube array.

6. The method of claim 4, wherein an inner surface of the mold is coated with a layer of mold releasing agent.

7. The method of claim 4, wherein the mold with the second opening opposite to the carbon nanotube array is covered on the carbon nanotube array from the first surface to the second surface, and the carbon nanotubes of the carbon nanotube array lean to the central axis of the carbon nanotube array under pressure of the sidewalls.

8. The method of claim 3, wherein the mold comprises a square frame with four sides joined end to end, and four isosceles trapezoid plates; a longer side of each isosceles trapezoid plate is fixed on the corresponding side of the square frame and rotatable around the longer side.

9. The method of claim 8, wherein a shape of the carbon nanotube array is square, and the mold is located around a square carbon nanotube array to press the carbon nanotube array by folding the four isosceles trapezoid plates.

10. The method of claim 1, wherein the liquid matrix material is a liquid phase change polymer, and the carbon nanotube array is immersed in the liquid phase change polymer.

11. The method of claim 1, wherein the liquid matrix material is a liquid phase change polymer or a low melting point metallic material, and the liquid matrix material is injected into the carbon nanotube array.

12. The method of claim 1, wherein the liquid matrix material is a low melting point metallic material, and the low melting point metallic material is plated into the carbon nanotube array.

13. The method of claim 12, wherein the low melting point metallic material is used as an anode, the carbon nanotube array is used as a cathode, and the mold is made of insulative material.

14. The method of claim 1, wherein the liquid matrix material is solidified by cooling, heating or adding an initiator.

15. The method of claim 1, further comprising a step (e) of removing the mold and the substrate.

16. The method of claim 15, wherein step (e) is executed by mechanical polishing, chemical etching or tearing directly.

17. A method for making a thermal interface material, the method comprising:
   (a) providing a carbon nanotube array comprising a plurality of carbon nanotubes on a substrate, the carbon nanotubes being substantially parallel to each other and substantially perpendicular to the substrate, the carbon nanotubes array having a central axis substantially parallel to each of the carbon nanotubes, the carbon nanotubes comprising a bottom end adjacent to the substrate and a top end away from the substrate;
   (b) slanting the carbon nanotubes of the carbon nanotube array toward the central axis of the carbon nanotubes array to obtain slanted carbon nanotubes, the top end of the slanted carbon nanotubes being closer to the central axis than the bottom end of the slanted carbon nanotubes;
(c) introducing a liquid matrix material into the slanted carbon nanotubes of the carbon nanotube array; and
(d) solidifying the liquid matrix material with the slanted carbon nanotubes to form a matrix.

18. The method of claim 17, further comprising slicing the thermal interface material to make the bottom ends and top ends of the nanotubes exposed from surfaces of the matrix.

19. The method of claim 17, further comprising etching the matrix to make the bottom ends and top ends of the nanotubes exposed from surfaces of the matrix.

20. A method for making a thermal interface material, the method comprising:
(a) providing a carbon nanotube array formed on a substrate, the carbon nanotube array comprises a plurality of carbon nanotubes substantially parallel to each other and substantially perpendicular to the substrate;
(b) slanting the carbon nanotubes of the carbon nanotube array toward the central axis of the carbon nanotube array to obtain slanted carbon nanotubes; and
(c) introducing a matrix to compound with the slanted carbon nanotubes of the carbon nanotube array.

* * * * *